(12) United States Patent
Hashizume

(10) Patent No.: US 12,414,315 B2
(45) Date of Patent: Sep. 9, 2025

(54) SILICON CARBIDE SCHOTTKY BARRIER DIODE

(71) Applicant: FUJI ELECTRIC CO., LTD., Kawasaki (JP)

(72) Inventor: Yuichi Hashizume, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 645 days.

(21) Appl. No.: 17/727,034

(22) Filed: Apr. 22, 2022

(65) Prior Publication Data

US 2022/0406948 A1 Dec. 22, 2022

(30) Foreign Application Priority Data

Jun. 21, 2021 (JP) .................................. 2021-102714

(51) Int. Cl.
*H10D 8/60* (2025.01)
*H01L 21/04* (2006.01)
(Continued)

(52) U.S. Cl.
CPC ........... *H10D 8/60* (2025.01); *H01L 21/0495* (2013.01); *H10D 8/051* (2025.01); *H10D 62/8325* (2025.01); *H10D 64/64* (2025.01)

(58) Field of Classification Search
CPC ...... H10D 8/60; H10D 8/051; H10D 62/8325; H10D 62/142; H10D 64/64;
(Continued)

(56) References Cited

U.S. PATENT DOCUMENTS

2006/0220027 A1 10/2006 Takahashi et al.
2013/0221477 A1 8/2013 Watanabe et al.
(Continued)

FOREIGN PATENT DOCUMENTS

JP H11330498 A 11/1999
JP 2012222060 A 11/2012
(Continued)

OTHER PUBLICATIONS

Japanese Office Action dated Feb. 25, 2025, in the counterpart Japanese Patent Application No. 2021-102714.

*Primary Examiner* — William B Partridge
*Assistant Examiner* — Chevy J Boegel
(74) *Attorney, Agent, or Firm* — Rabin & Berdo, P.C.

(57) ABSTRACT

A silicon carbide semiconductor device is a SiC-SBD that has, in an active region, at a front surface of a semiconductor substrate containing silicon carbide, a mixture of a SBD structure having Schottky barrier junctions between a titanium film that is a lowermost layer of a front electrode and an n⁻-type drift region, and a JBS structure having pn junction portions between p-type regions and the n⁻-type drift region. The p-type regions form ohmic junctions with the titanium film that is the lowermost layer of the front electrode. After an ion implantation for the p-type regions, activation annealing is performed at a temperature in a range of 1700 degrees C. to 1900 degrees C. for a treatment time exceeding 20 minutes, whereby contact resistance between the titanium film and the p-type regions is adjusted to be in a range of about $5\times10^{-4}$ $\Omega\cdot cm^2$ to $8\times10^{-3}$ $\Omega\cdot cm^2$.

2 Claims, 10 Drawing Sheets

(51) Int. Cl.
*H10D 8/01* (2025.01)
*H10D 62/832* (2025.01)
*H10D 64/64* (2025.01)

(58) Field of Classification Search
CPC ............. H10D 30/0275; H10D 84/131; H10D 84/611; H01L 21/0495; H01L 21/046; H01L 21/0485; H02K 15/0646; H10F 71/139
USPC .......................................................... 257/77
See application file for complete search history.

(56) References Cited

U.S. PATENT DOCUMENTS

| 2015/0194313 | A1* | 7/2015 | Ryo | ........................ | H10D 8/60 |
| | | | | | 438/478 |
| 2018/0061951 | A1* | 3/2018 | Kitamura | ................ | H10D 8/051 |
| 2018/0158914 | A1* | 6/2018 | Kitamura | ............ | H01L 21/0485 |
| 2018/0308975 | A1* | 10/2018 | Ohse | .................... | H10D 12/031 |
| 2020/0258996 | A1* | 8/2020 | Ohse | ....................... | H10D 62/83 |
| 2021/0175369 | A1 | 6/2021 | Ohse et al. | | |
| 2021/0328025 | A1* | 10/2021 | Ohse | ....................... | H01L 21/28 |

FOREIGN PATENT DOCUMENTS

| JP | 5474218 | B2 | 4/2014 |
| JP | 2021-093522 | A | 6/2021 |
| WO | 2005076327 | A1 | 8/2005 |

\* cited by examiner

FIG.11

| | DOPING CONCENTRATION (/cm³) | ACCELERATION ENERGY (keV) | IMPLANT TEMPERATURE (°C) | ACTIVATION TEMPERATURE (°C) | ACTIVATION TIME (min) | CONTACT METAL | CONTACT RESISTANCE (Ω·cm²) |
|---|---|---|---|---|---|---|---|
| FIRST SAMPLE | $6 \times 10^{19}$ | 30 | 500 | 1643 | 3 | NONE | $7.82 \times 10^{-2}$ |
| SECOND SAMPLE | $6 \times 10^{19}$ | 30 | 500 | 1700 | 3 | NONE | $6.69 \times 10^{-2}$ |
| THIRD SAMPLE | $6 \times 10^{19}$ | 30 | 500 | 1700 | 30 | NONE | $5.00 \times 10^{-3}$ |

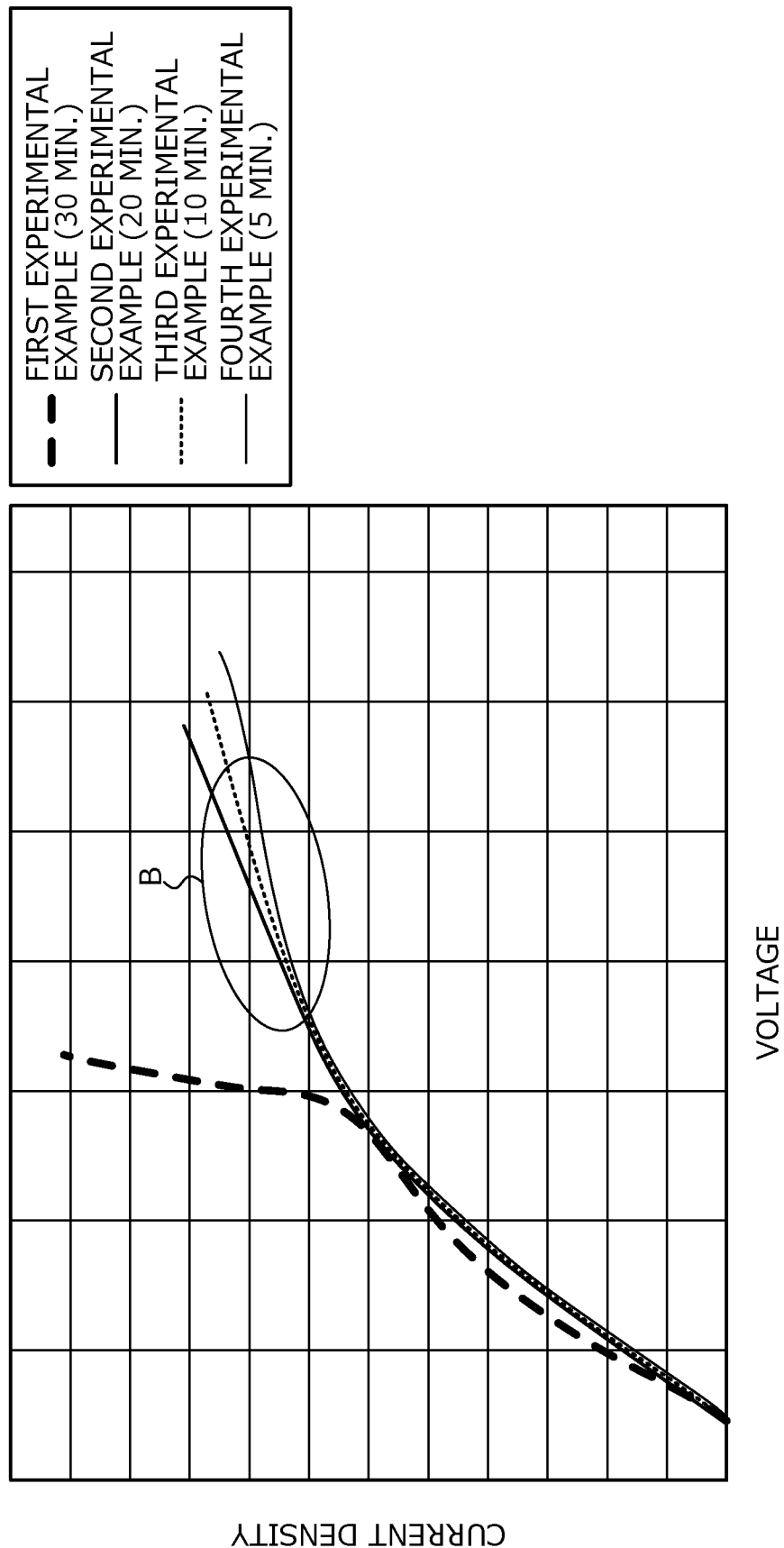

SILICON CARBIDE SCHOTTKY BARRIER DIODE

CROSS REFERENCE TO RELATED APPLICATIONS

This application is based upon and claims the benefit of priority of the prior Japanese Patent Application No. 2021-102714, filed on Jun. 21, 2021, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

In a Schottky barrier diode (SiC-SBD) having silicon carbide (SiC) as a semiconductor material, a junction barrier Schottky (JBS) structure is commonly known in which Schottky barrier junctions between a front electrode (anode electrode) and an $n^-$-type drift region, and pn junctions between p-type regions and the $n^-$-type drift region are both present on a front side of a semiconductor substrate (semiconductor chip). The p-type regions configuring the JBS structure are selectively formed in surface regions of the semiconductor substrate, at a front surface thereof by ion implantation of a p-type impurity and a heat treatment (activation annealing) for impurity activation thereafter. Conditions of the activation annealing include a temperature of about 1640 degrees C. and a treatment time of about 3 minutes.

When forward current flowing in the SiC-SBD is the rated current or less, the forward current flows only along a path from the front electrode, through the Schottky barrier junctions and to back electrode (cathode electrode), and no current flows through the p-type regions configuring the JBS structure. On the other hand, in an instance in which a large current (surge current) exceeding the rated current flows in the forward direction of the SiC-SBD such as during surge application due to lightning, the path through the Schottky barrier junctions alone cannot bear all the surge current and the surge current further flows from the front electrode, into the p-type regions configuring the JBS structure. In this case, a pn diode formed by the pn junctions between these p-type regions and the $n^-$-type drift region operates bipolarly, and the forward current further flows through the pn diode.

As a conventional SiC-SBD, a device has been proposed in which low-resistance ohmic junctions are formed with the front electrode by $p^+$-type contact regions provided between the front electrode (anode electrode) and the p-type regions configuring the JBS structure (for example, refer to Japanese Patent No. 5474218). Japanese Patent No. 5474218 discloses that the $p^+$-type contact regions have an impurity concentration of at least $1\times10^{19}/cm^3$ and are formed in surface regions of the p-type regions configuring the JBS structure by ion-implantation of a p-type impurity, and activation annealing thereafter is performed at a temperature of about 1700 degrees C. for 10 minutes. As a result, contact resistance between the $p^+$-type contact regions and the front electrode containing titanium (Ti) or nickel (Ni) is reduced to about $1\times10^{-2}$ $\Omega\cdot cm^2$.

SUMMARY OF THE INVENTION

According to an embodiment of the invention, a method of manufacturing a silicon carbide semiconductor device includes: preparing a semiconductor substrate by forming a first-conductivity-type region that constitutes a first main surface of the semiconductor substrate, the semiconductor substrate containing silicon carbide and having the first main surface and a second main surface that are opposite to each other; ion-implanting a second-conductivity-type impurity into the semiconductor substrate to selectively form at least one second-conductivity-type region at the first main surface, thereby forming a pn junction between the at least one second-conductivity-type region and the first-conductivity-type region; performing a heat treatment thereby activating the second-conductivity-type impurity; forming a titanium film as a first electrode on the first main surface of the semiconductor substrate after activating the second-conductivity-type impurity, to form a Schottky barrier junction between the titanium film and the first-conductivity-type region, and to form an ohmic junction between the titanium film and the at least one second-conductivity-type region; and forming a second electrode on the second main surface of the semiconductor substrate. The heat treatment is performed at a temperature in a range of 1700 degrees C. to 1900 degrees C. for a treatment time of more than 20 minutes.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 11 is a table showing results of measurement of contact resistance between a front electrode and p-type regions configuring a JBS structure of a first experimental example.

FIG. 12 is a characteristics diagram depicting current-voltage characteristics for the first to fourth experimental examples.

DETAILED DESCRIPTION OF THE INVENTION

Figure 1:
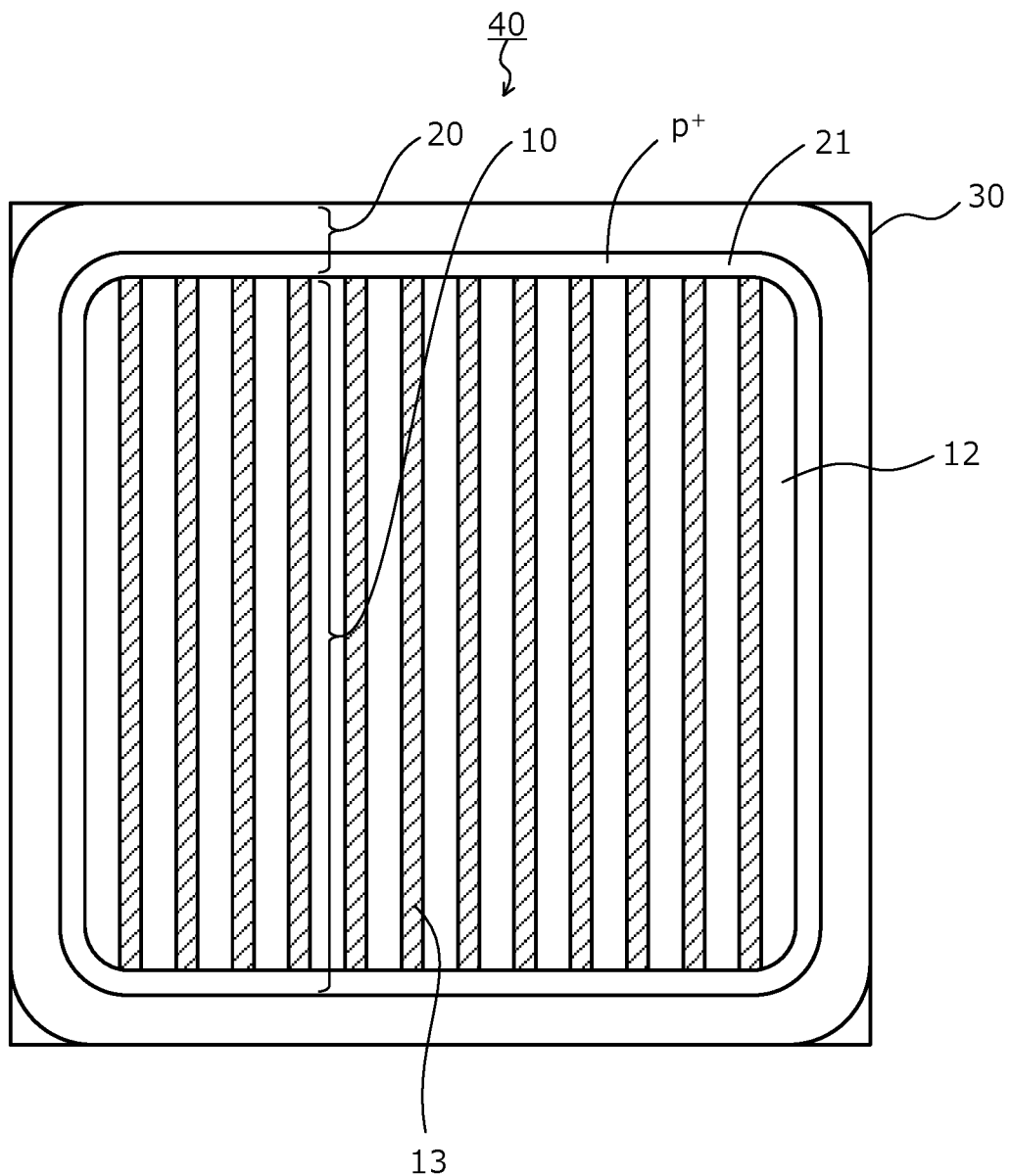
FIG. 1 is a plan view depicting an example of a layout when a silicon carbide semiconductor device according to an embodiment is viewed from a front side of a semiconductor substrate.

First, problems associated with the conventional techniques are discussed. In the conventional SiC-SBD, when large current (surge current) due to surge application flows through the p-type regions configuring the JBS structure, bipolar operation by the pn junctions between the p-type regions and the $n^-$-type drift region is inhibited due to the contact resistance between the p-type regions and the front electrode being high. As a result, the surge current concentrates locally, whereby the SiC-SBD (semiconductor substrate) generates heat, leading to destruction.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and will not be repeatedly described.

Figure 2:
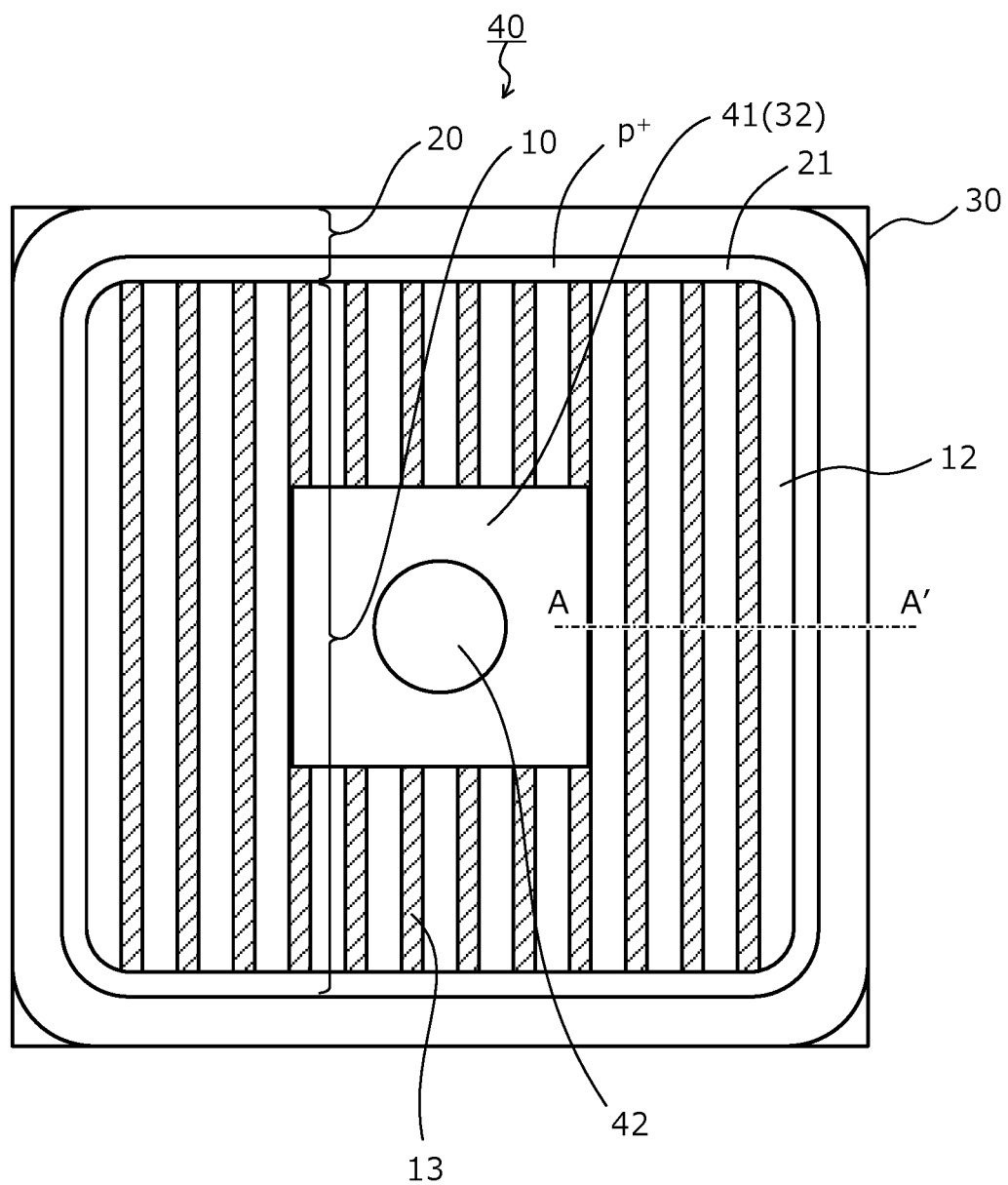
FIG. 2 is a plan view depicting an example of a layout when the silicon carbide semiconductor device according to the embodiment is viewed from the front side of the semiconductor substrate.
Figure 3:
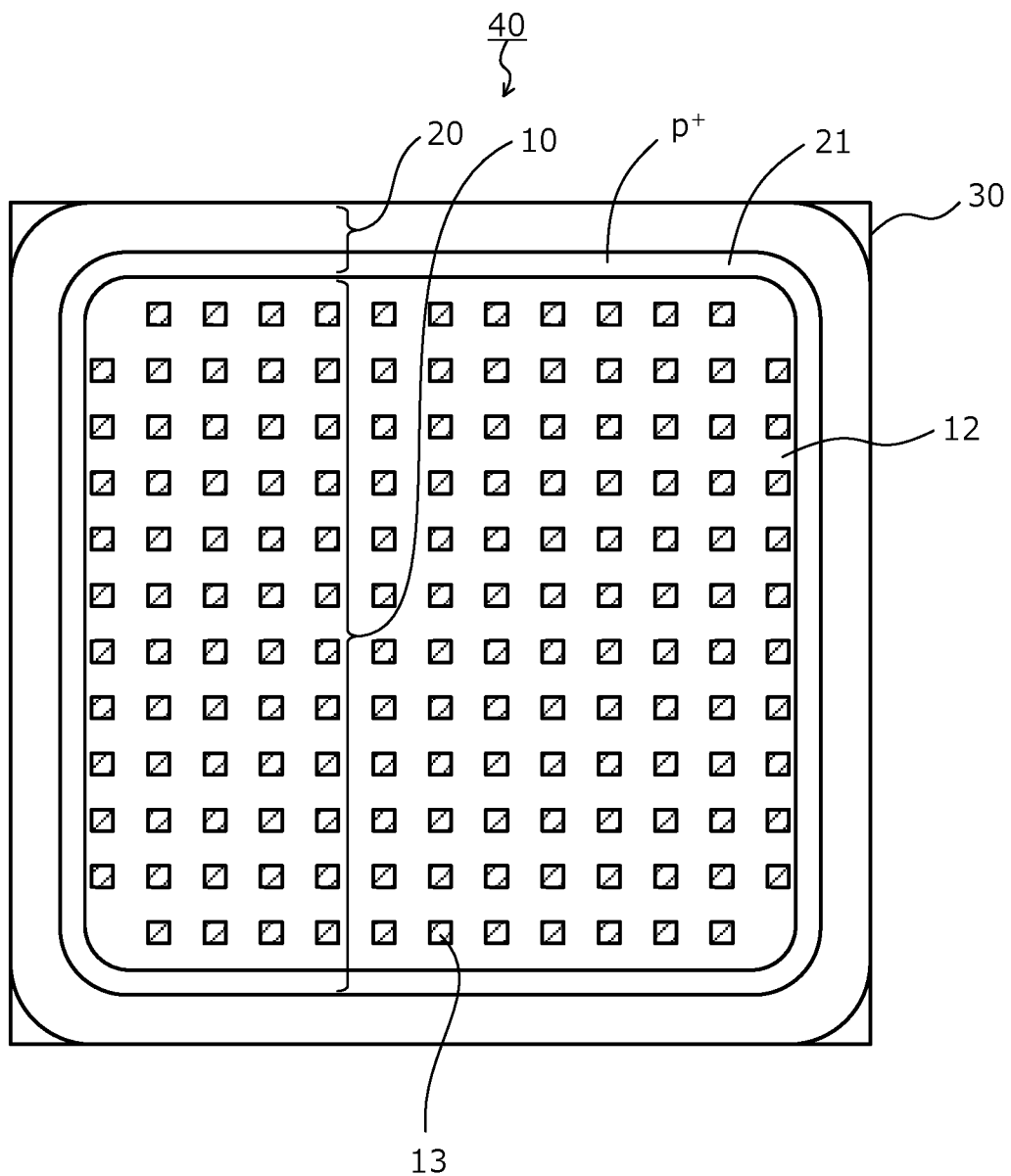
FIG. 3 is a plan view depicting an example of a layout when the silicon carbide semiconductor device according to the embodiment is viewed from the front side of the semiconductor substrate.

A structure of a silicon carbide semiconductor device fabricated (manufactured) by a method of manufacturing a silicon carbide semiconductor device according to an embodiment is described with reference to FIGS. 1 to 3. FIGS. 1, 2, and 3 are plan views depicting examples of layouts when the silicon carbide semiconductor device according to the embodiment is viewed from a front side of a semiconductor substrate. FIGS. 1 and 3 depict examples of layouts of p-type regions 13. FIG. 2 depicts an example of a layout of a bonding pad 41 in an instance in which the example of the layout of the p-type regions 13 depicted in FIG. 1 is adopted.

A silicon carbide semiconductor device 40 according to the embodiment depicted in FIGS. 1 and 2 is a SiC-SBD having a JBS structure in which, in an active region 10, Schottky barrier junctions between a front electrode (first electrode) 14 (refer to FIG. 4) and an $n^-$-type drift region (first-conductivity-type region) 12, and pn junctions between p-type regions (second-conductivity-type regions) 13 and the $n^-$-type drift region 12 are both present on a front side (side having first main surface) of a semiconductor substrate (semiconductor chip) 30 containing silicon carbide (SiC).

The $n^-$-type drift region 12 and the p-type regions 13 are disposed substantially equally in a substantially uniform pattern within a plane of the active region 10. Disposed substantially equally in a substantially uniform pattern means being aligned so as to be disposed at a same interval in a same pattern within a range including an allowable tolerance due to process variation. The $n^-$-type drift region 12 reaches the front surface of the semiconductor substrate 30, from between adjacent p-type regions of the p-type regions 13.

In particular, the $n^-$-type drift region 12 and the p-type regions 13, for example, may be disposed adjacent to one another in a striped pattern extending in a same longitudinal direction parallel to the front surface of the semiconductor substrate 30 while repeatedly alternating one another along a transverse direction that is orthogonal to the longitudinal direction (FIG. 1). The p-type regions 13, for example, may be disposed in a matrix-like pattern. In this case, the $n^-$-type drift region 12 surrounds, in a grid-like pattern, the p-type regions 13 that are disposed in a matrix-like pattern (FIG. 3).

The active region 10 is a region through which forward current of the SiC-SBD flows. The active region 10, for example, has a substantially rectangular shape in a plan view and is disposed in substantially a center (chip center) of the semiconductor substrate 30. An edge termination region 20 is a region between the active region 10 and an end (chip end) of the semiconductor substrate 30; the edge termination region 20 surrounds a periphery of the active region 10 and has a function of mitigating electric field of a front side of the semiconductor substrate 30 and sustaining breakdown voltage. The breakdown voltage is a voltage limit at which no erroneous operation or destruction of a device element occurs.

Figure 4:
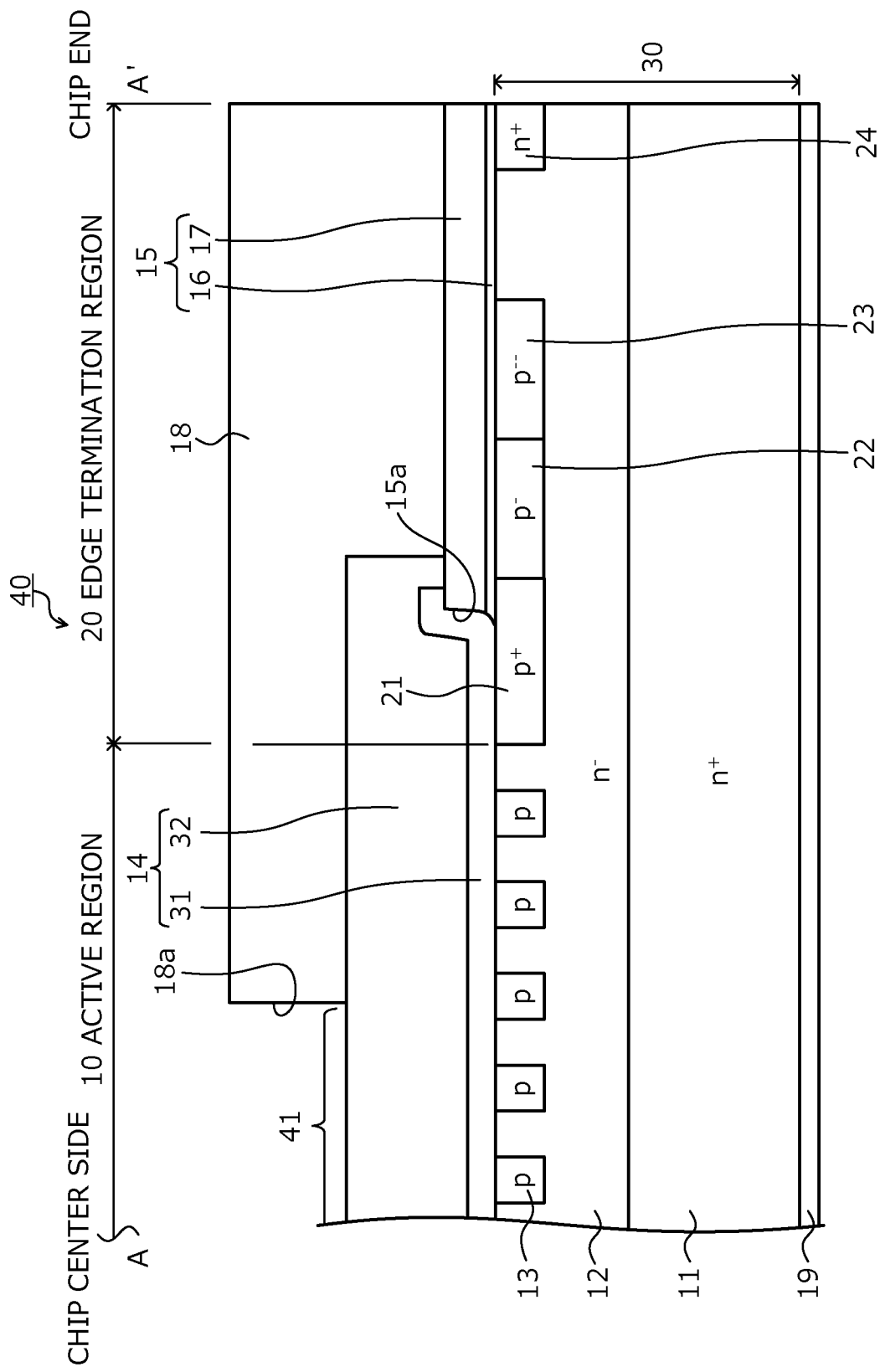
FIG. 4 is a cross-sectional view depicting a structure along cutting line A-A' in FIG. 2.

In the edge termination region 20, a voltage withstanding structure such as a junction termination extension (JTE) structure is disposed (refer to FIG. 4). The JTE structure is a voltage withstanding structure in which, from a center-side thereof (side thereof nearest the chip center) to end-sides thereof (sides thereof nearest the chip end), plural p-type regions (in FIG. 4, reference numerals 22, 23) having differing impurity concentrations are disposed in descending order of impurity concentration, in a concentric pattern surrounding the periphery of the active region 10 and centered around a center of the active region, in a plan view.

Further, in the edge termination region 20, between the active region 10 and the JTE structure, a field limiting ring (FLR) 21 is disposed. The FLR 21 is a $p^+$-type region that surrounds the periphery of the active region 10 in a substantially rectangular shape in a plan view, and is adjacent to a $p^-$-type region 22 that is innermost in the JTE structure. Ends of the p-type regions 13 in the longitudinal direction may be in contact with the FLR 21 (FIG. 1).

In an instance in which the ends of the p-type regions 13 in the longitudinal direction are not in contact with the FLR 21 (not depicted) or an instance in which the p-type regions 13 are disposed in a matrix-like pattern (FIG. 3), adjacent p-type regions of the p-type regions 13 may be continuous with each other at a predetermined location in the active region 10 or may be separate from each other. Even in an instance in which the ends of the p-type regions 13 in the longitudinal direction are in contact with the FLR 21 (FIG. 1), adjacent p-type regions of the p-type regions 13 may be continuous at a predetermined location in the active region 10.

The bonding pad 41 is provided at the front surface of the semiconductor substrate 30. At the time of mounting the semiconductor substrate 30 to the bonding pad 41, for example, a non-depicted aluminum (Al) wire, which is a most common wiring connection is bonded (joined) to the bonding pad 41. In FIG. 2, a bonding portion 42 between the bonding pad 41 and aluminum wire (not depicted) is depicted as a circular shape in a plan view.

Preferably, the bonding pad 41 may be disposed in the center of the semiconductor substrate 3, however, disposal of the bonding pad 41 and the shape thereof in a plan view may be suitably set. As described above, the $n^-$-type drift region 12 and the p-type regions 13 are disposed substantially equally in a substantially uniform pattern within a plane of the active region 10, whereby even when the bonding pad 41 is not disposed in the center of the semiconductor substrate 30, electrical characteristics are not adversely affected.

Next, a cross-section of the structure of the silicon carbide semiconductor device 40 according to the embodiment is described. FIG. 4 is a cross-sectional view depicting the structure along cutting line A-A' in FIG. 2. As described above, in the silicon carbide semiconductor device 40 according to the embodiment, the active region 10 of the semiconductor substrate 30 containing silicon carbide is the SiC-SBD configuring the JBS structure while in the edge termination region 20, the JTE structure is provided as a voltage withstanding structure.

The semiconductor substrate 30 is an epitaxial substrate in which an n$^-$-type epitaxial layer constituting the n$^-$-type drift region 12 is stacked on a front surface of an n$^+$-type starting substrate 11 containing silicon carbide. The n$^+$-type starting substrate 11 is an n$^+$-type cathode region. The semiconductor substrate 30 has a main surface with the n$^-$-type drift region 12 (surface of the n$^-$-type epitaxial layer constituting the n$^-$-type drift region 12) assumed as the front surface and a main surface with the n$^+$-type starting substrate 11 (back surface of the n$^+$-type starting substrate 11) assumed as a back surface (second main surface).

In the active region 10, between the front surface of the semiconductor substrate 30 and the n$^-$-type drift region 12, at least one of the p-type regions 13 configuring the JBS structure is selectively provided. The p-type regions 13 are exposed at the front surface of the semiconductor substrate 30 and are in contact with the n$^-$-type drift region 12. The p-type regions 13 are diffused regions formed by a later-described first ion implantation (step S2 in FIG. 5). A doped concentration (impurity concentration) of the p-type regions 13 is, for example, in a range of about $3\times10^{19}$/cm$^3$ to $5\times10^{20}$/cm$^3$.

An effective majority carrier (hole) concentration of the p-type regions 13 is determined by an activation rate of a p-type impurity implanted by the first ion implantation for forming the p-type regions 13 (hereinafter, activation rate of the p-type regions 13). In particular, the effective majority carrier concentration of the p-type regions 13 is calculated by multiplying the doped concentration of the p-type regions 13 by the activation rate of the p-type regions 13 and is, for example, in a range of about 70% to 90% relative to the doped concentration of the p-type regions 13. The activation rate of the p-type regions 13 is adjusted by an activation annealing at later-described step S3 (refer to FIG. 5).

In the active region 10, at the front surface of the semiconductor substrate 30, the n$^-$-type drift region 12 that extends from the n$^+$-type starting substrate 11 is exposed at portions excluding portion where the p-type regions 13 are exposed. A periphery of each of the p-type regions 13 is surrounded by the n$^-$-type drift region 12. Being exposed at the front surface of the semiconductor substrate 30 in the active region 10 means being connected to a later-described front electrode 14 at the front surface of the semiconductor substrate 30.

In the edge termination region 20, in surface regions at the front surface of the semiconductor substrate 30, the FLR 21, at least one p-type region (herein, two including a p$^-$-type region 22 and a p$^{--}$-type region 23) configuring the JTE structure, and an n$^+$-type channel stopper 24 are each selectively provided. The FLR 21, the p$^-$-type region 22, the p$^{--}$-type region 23, and the n$^+$-type channel stopper 24 are provided between the front surface of the semiconductor substrate 30 and the n$^-$-type drift region 12.

The FLR 21, the p$^-$-type region 22, the p$^{--}$-type region 23, and the n$^+$-type channel stopper 24 are exposed at the front surface of the semiconductor substrate 30 and are in contact with the n$^-$-type drift region 12. Depths of the FLR 21, the p$^-$-type region 22, the p$^-$-type region 23, and the n$^+$-type channel stopper 24 may be substantially equal to the depth of the p-type regions 13. The active region 10 is closer to the chip center than is the FLR 21. The p$^-$-type region 22 is provided closer to the chip end than is the FLR 21 and is adjacent to the FLR 21.

The p$^-$-type region 23 is provided closer to the chip end than is the p$^-$-type region 22 and is adjacent to the p$^-$-type region 22. The n$^+$-type channel stopper 24 is closer to the chip end than is the p$^-$-type region 23 and is provided apart from the p$^-$-type region 23. The n$^+$-type channel stopper 24 is exposed at an end (chip end) of the semiconductor substrate 30. The n$^-$-type drift region 12 extends from the n$^+$-type starting substrate 11 and is exposed at the front surface of the semiconductor substrate 30, between the p$^{--}$-type region 23 and the n$^+$-type channel stopper 24.

The front surface of the semiconductor substrate 30 is covered by a field oxide film 15. The field oxide film 15, for example, may be a layered film in which a thermal oxide film 16 and a deposited oxide film 17 are sequentially stacked. The field oxide film 15 includes the deposited oxide film 17, whereby formation is possible in a shorter time compared to an instance in which the field oxide film 15 is entirely constituted by the thermal oxide film 16. The thermal oxide film 16 may enhance adhesiveness between the semiconductor substrate 30 and the field oxide film 15.

In the field oxide film 15, a contact hole 15a exposing an entire area of the front surface of the semiconductor substrate 30 in the active region 10 is provided. An entire area (i.e., the n$^-$-type drift region 12 and the p-type regions 13 in the active region 10) of the active region 10 and a portion of the FLR 21 in the edge termination region 20, the portion facing the chip center, are exposed in the contact hole 15a of the field oxide film 15.

In the contact hole 15a of the field oxide film 15, the front electrode 14 is provided on an entire area of the front surface of the semiconductor substrate 30. The front electrode 14 functions as an anode electrode. The front electrode 14 may extend onto the field oxide film 15. The front electrode 14 has a 2-layer structure in which a titanium (Ti) film 31 and an aluminum (Al) alloy film (metal film containing aluminum) 32 are sequentially stacked.

Between the front electrode 14 and the front surface of the semiconductor substrate 30 is free of a contact metal (for example, a nickel silicide (NixSiy) film, where, x and y are arbitrary integers) that forms a low-resistance ohmic junction with the semiconductor substrate 30 and that is formed by a silicide reaction with the semiconductor substrate 30. Therefore, in the contact hole 15a of the field oxide film 15, the titanium film 31 is in contact with an entire area of the front surface of the semiconductor substrate 30 and is in contact with the n$^-$-type drift region 12, the p-type regions 13, and the FLR 21.

The titanium film 31 has contact areas that are in contact with the n$^-$-type drift region 12 and that are Schottky electrodes forming Schottky barrier junctions with the n$^-$-type drift region 12. The titanium film 31 further has contact areas that are in contact with the p-type regions 13 and the FLR 21 and that are ohmic electrodes forming ohmic junctions with the p-type regions 13 and the FLR 21. The contact areas of the titanium film 31 in contact with the p-type regions 13 and the FLR 21 are not converted into a silicide, i.e., are free of a silicide.

The higher is the effective majority carrier concentration of the p-type regions 13, the lower is an ohmic property (the contact resistance) between the titanium film 31 and the p-type regions 13. The effective majority carrier concentration of the p-type regions 13 is adjusted by the activation annealing at later-described step S3 and is higher than the effective majority carrier concentration of the p-type regions configuring the JBS structure of the conventional SiC-SBD that is free of a contact metal such as a nickel silicide film.

Therefore, the ohmic junctions between the titanium film 31 and the p-type regions 13 have a low resistance compared to the ohmic junctions between the p-type regions configuring the JBS structure and the titanium film of the conventional SiC-SBD that is free of a contact metal such as a nickel silicide film. No contact metal such as a nickel silicide film and no $p^+$-type contact regions like those in Japanese Patent No. 5474218 described above are formed, whereby cost reductions and simplification of the manufacturing process are possible.

In particular, the contact resistance between the titanium film 31 and the p-type regions 13, for example, is within a range of about $5 \times 10^{-4}$ Ω·cm$^2$ to $8 \times 10^{-3}$ Ω·cm$^2$. The lower limit of the contact resistance between the titanium film 31 and the p-type regions 13 is a limit value that may be realized by the activation annealing at later-described step S3. When the contact resistance between the titanium film 31 and the p-type regions 13 exceeds the upper limit described above, an effect (enhancement of surge current capability) of the present embodiment is difficult to realize.

Preferably, the contact resistance between the titanium film 31 and the p-type regions 13, for example, may be within a range of about $3 \times 10^{-3}$ Ω·cm$^2$ to $7 \times 10^{-3}$ Ω·cm$^2$. The FLR 21 may be formed concurrently with the p-type regions 13 and contact resistance between the titanium film 31 and the FLR 21 may be set to be substantially equal to the resistance value of the contact resistance between the titanium film 31 and the p-type regions 13. Substantially equal resistance values means that the resistance values are the same within a range that includes allowable tolerances due to process variation.

The aluminum alloy film 32 covers an entire area of the surface of the titanium film 31 and via the titanium film 31, is electrically connected to the $n^-$-type drift region 12, the p-type regions 13, and the FLR 21. On the field oxide film 15, the aluminum alloy film 32 may extend closer to the chip end than does the titanium film 31. The aluminum alloy film 32, for example, is an aluminum-silicon (AlSi) film. Instead of the aluminum alloy film 32, an aluminum film may be provided.

On the most superficial surface of the front surface of the semiconductor substrate 30, for example, a passivation film 18 containing a polyimide (PI) is provided. The passivation film 18 covers the front surface of the semiconductor substrate 30 and is a protective film for protecting the front electrode 14 and the field oxide film 15. In the passivation film 18, an opening 18a that exposes a portion of the aluminum alloy film 32 is provided in the active region 10.

The portion of the aluminum alloy film 32 exposed in the opening 18a of the passivation film 18 functions as the bonding pad 41 (anode pad, refer to FIG. 2). A back electrode (second electrode) 19 is provided on an entire area of the back surface (back surface of the $n^+$-type starting substrate 11) of the semiconductor substrate 30. The back electrode 19 forms ohmic junctions with the $n^+$-type starting substrate 11 and is electrically connected to the $n^+$-type starting substrate 11. The back electrode 19 functions as a cathode electrode.

Operation of the silicon carbide semiconductor device 40 according to the embodiment is described. In an instance in which forward current flowing through the silicon carbide semiconductor device 40 according to the embodiment (SiC-SBD) is at most the rated current, the forward current flows only along a path from the front electrode 14 (anode electrode), through the Schottky barrier junctions between the front electrode 14 and the $n^-$-type drift region 12, to the back electrode 19 (cathode electrode) and the current does not flow through the p-type regions 13 that configure the JBS structure.

On the other hand, in an instance in which the forward current that flows through the silicon carbide semiconductor device 40 according to the embodiment is a large current (surge current) that exceeds the rated current and flows during surge application due to lightning, the described path through the Schottky barrier junctions between the front electrode 14 and the $n^-$-type drift region 12 cannot bear all the surge current and the surge current further flows from the front electrode 14 and through the p-type regions 13 that configure the JBS structure.

With the surge current flowing into the p-type regions 13 as a base current, bipolar operation by pn junction portions between the p-type regions 13 and the $n^-$-type drift region 12 occurs and forward current also flows through a parasitic diode formed by the pn junctions. The timing at which the surge current flows into the p-type regions 13 is determined by a contact resistance value between the p-type regions 13 and the front electrode 14.

In the present embodiment, even without a contact metal such as a nickel silicide film or $p^+$-type contact regions, such as those in Japanese Patent No. 5474218 described above, between the titanium film 31 and the p-type regions 13, the activation annealing at later-described step S3 (refer to FIG. 5) is performed, whereby contact resistance between the p-type regions 13 and the front electrode 14 may be reduced to a predetermined value, as compared to the conventional SiC-SBD that is free of a contact metal such as a nickel silicide film.

As a result, compared to the conventional SiC-SBD that is free of a contact metal such as a nickel silicide film, the flow of surge current from the front electrode 14 to the p-type regions 13 is facilitated, whereby bipolar operation by the pn junction portions between the p-type regions 13 and the $n^-$-type drift region 12 is facilitated. Therefore, local concentration of surge current is inhibited compared to the conventional SiC-SBD that is free of a contact metal such as a nickel silicide film.

Figure 5:
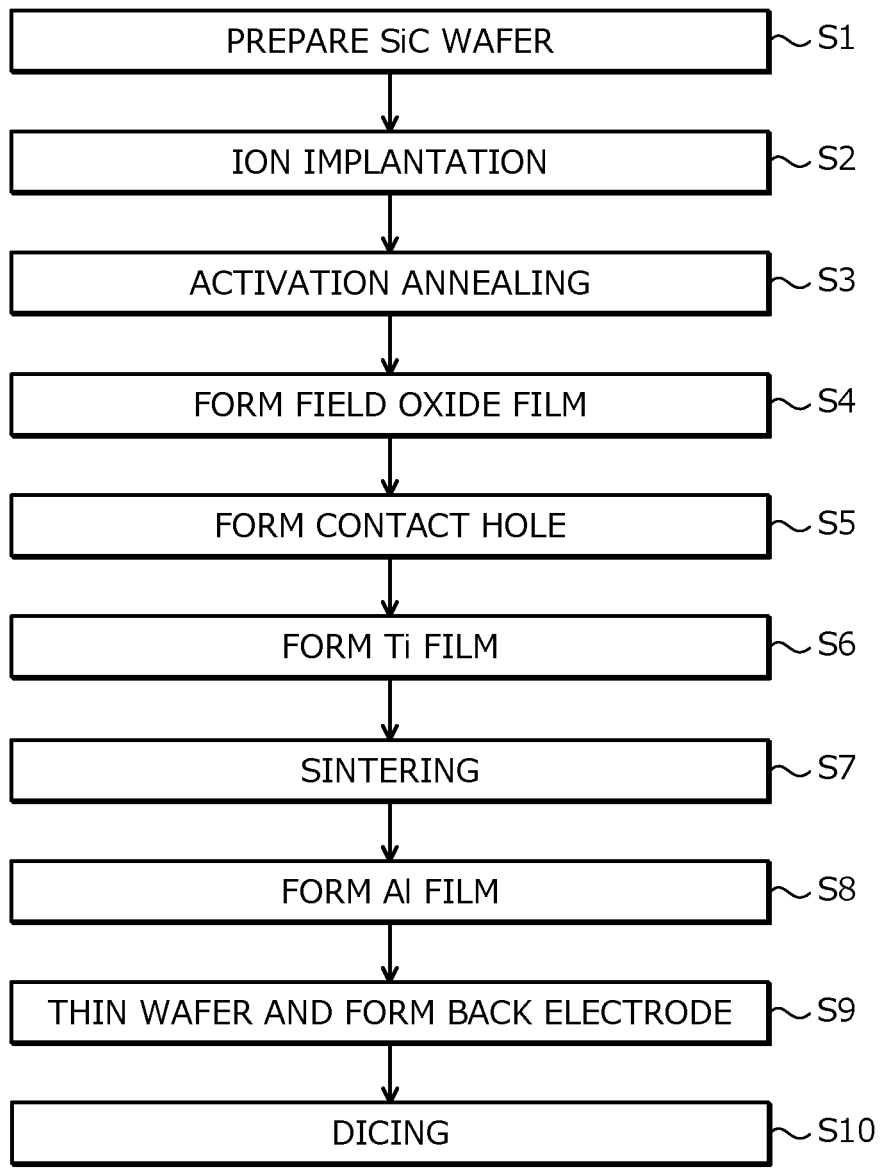
FIG. 5 is a flowchart depicting an outline of a method of manufacturing the silicon carbide semiconductor device according to the embodiment.
Figure 6:
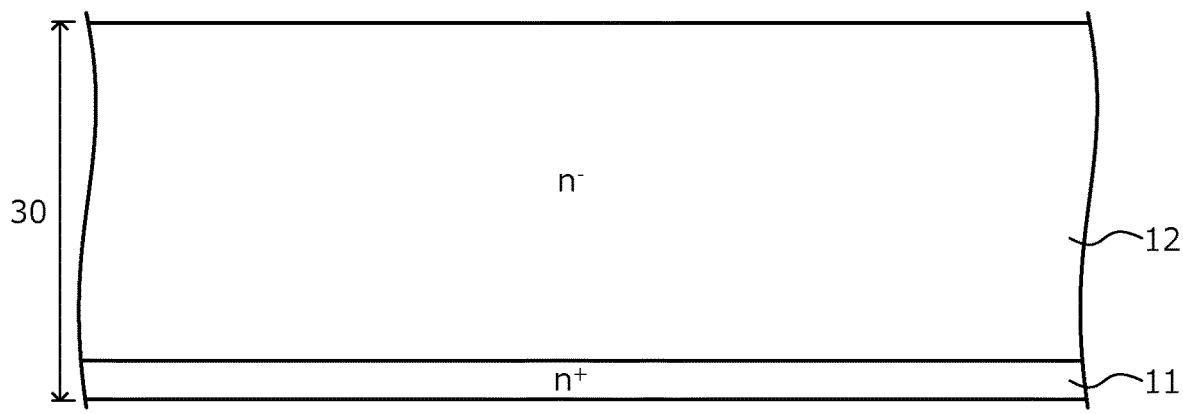
FIG. 6 is a cross-sectional view depicting a state of the silicon carbide semiconductor device according to the embodiment during manufacture.

Next, a method of manufacturing the silicon carbide semiconductor device 40 according to the embodiment is described. FIG. 5 is a flowchart depicting an outline of the method of manufacturing the silicon carbide semiconductor device according to the embodiment. FIGS. 6, 7, 8, 9, and 10 are cross-sectional views depicting states of the silicon carbide semiconductor device according to the embodiment during manufacture. First, as depicted in FIG. 6, as the $n^+$-type starting substrate (starting wafer) 11, for example, a four-layer periodic hexagonal crystal (4H-SiC) substrate containing silicon carbide and doped with nitrogen (N) to a concentration of about $5 \times 10^{18}$/cm$^3$ is prepared.

The front surface of the $n^+$-type starting substrate 11 may have, for example, an off-angle of about 4 degrees with respect to the (0001) plane. Next, on the front surface of the $n^+$-type starting substrate 11, for example, the $n^-$-type epitaxial layer constituting the n⁻-type drift region 12 and doped with nitrogen to a concentration in a range of about $1.0 \times 10^{16}/cm^3$ to $5.0 \times 10^{16}/cm^3$ is epitaxially grown. In FIGS. 4 and 8 to 10, while thicknesses of these layers are depicted in a simplified manner, the thickness of the n⁺-type starting substrate 11 constituting the n⁺-type cathode region may be, for example, about 350 µm and the thickness of the n⁻-type epitaxial layer constituting the n⁻-type drift region 12 may be, for example, about 6 µm.

By the processes up to here, the semiconductor substrate (semiconductor wafer: SiC wafer) 30 in which the n⁻-type epitaxial layer constituting the n⁻-type drift region 12 is stacked on the front surface of the n⁺-type starting substrate 11 containing silicon carbide is fabricated (step S1: first process). As described above, the semiconductor substrate 30 has a main surface with the n⁻-type drift region 12 as the front surface and a main surface with the n⁺-type starting substrate 11 as a back surface. In the process at step S1, as described above, the n⁺-type starting substrate 11 may be prepared and the semiconductor substrate 30 may be fabricated, or the semiconductor substrate 30 itself may be purchased.

Figure 7:
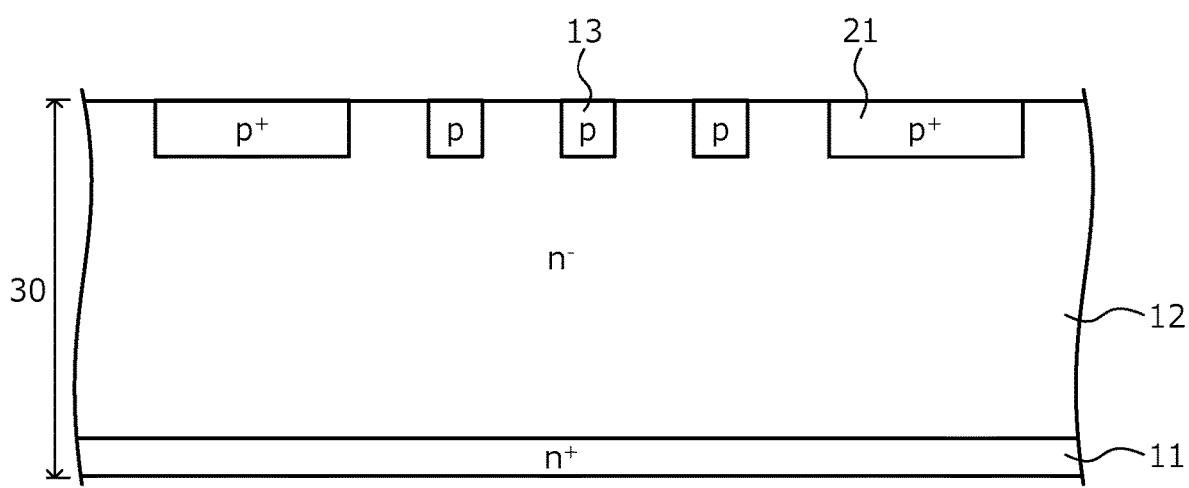
FIG. 7 is a cross-sectional view depicting a state of the silicon carbide semiconductor device according to the embodiment during manufacture.

Next, as depicted in FIG. 7, by photolithography and the first ion implantation of a p-type impurity such as aluminum, in the active region 10 (refer to FIGS. 1 and 4), in a surface region of the semiconductor substrate 30, at the front surface thereof (surface region of the n⁻-type epitaxial layer constituting the n⁻-type drift region 12), at least one of the p-type regions 13 configuring the JBS structure and the FLR 21 are each selectively formed (step S2 (part 1): second process). As a result, the pn junction portions between the p-type regions 13 and the n⁻-type drift region 12 are formed.

Figure 8:
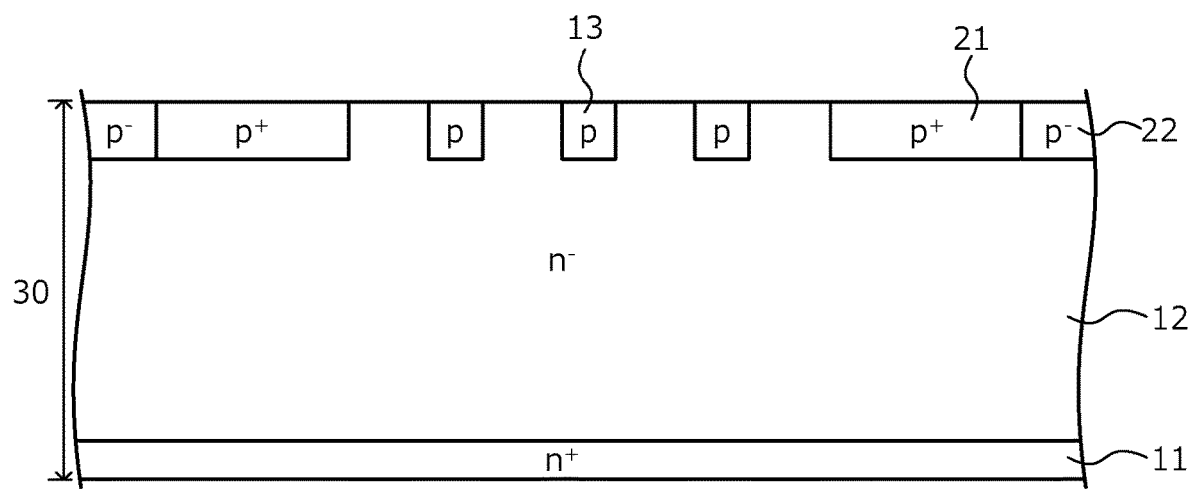
FIG. 8 is a cross-sectional view depicting a state of the silicon carbide semiconductor device according to the embodiment during manufacture.
Figure 9:
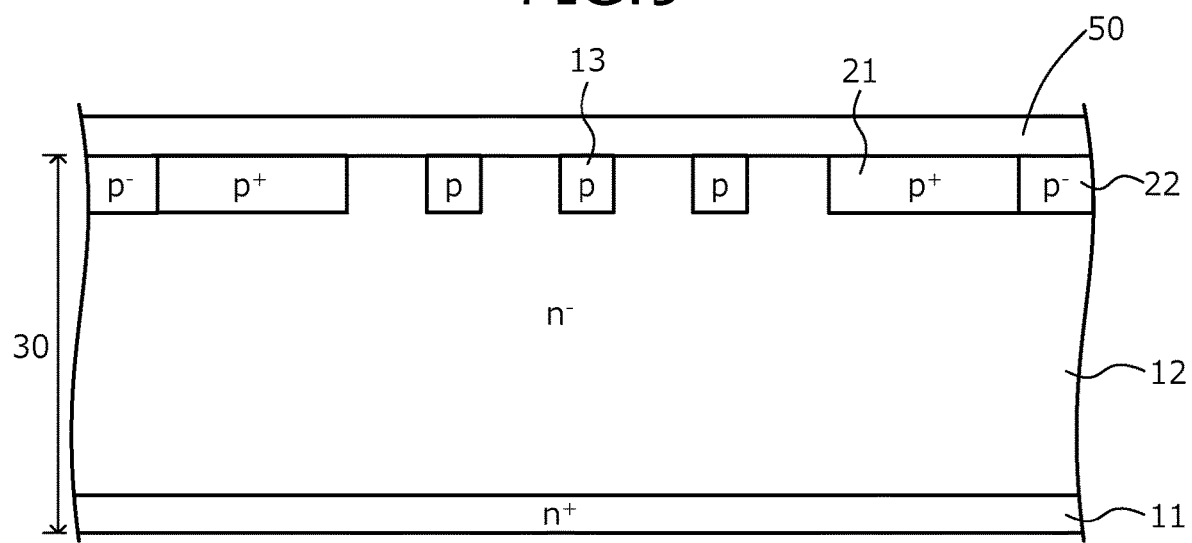
FIG. 9 is a cross-sectional view depicting a state of the silicon carbide semiconductor device according to the embodiment during manufacture.
Figure 10:
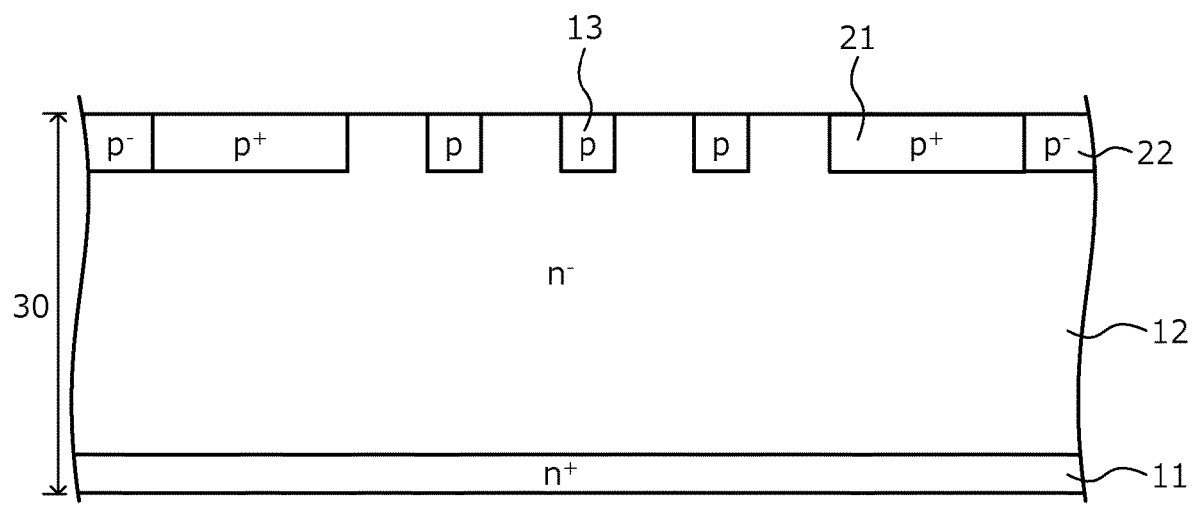
FIG. 10 is a cross-sectional view depicting a state of the silicon carbide semiconductor device according to the embodiment during manufacture.

For simplification, fewer of the p-type regions 13 are depicted in FIG. 7 (herein, 3) than in FIG. 1 (similarly in FIGS. 8 to 10). The p-type regions 13 are disposed at equal intervals in a direction parallel to the front surface of the semiconductor substrate 30. The first ion implantation, for example, is performed while heating the semiconductor substrate 30 at a temperature of about 500 degrees C. Conditions of the first ion implantation, for example, include a doped concentration in a range of $3 \times 10^{19}/cm^3$ to $5 \times 10^{29}/cm^3$ and an acceleration energy of about 30 keV. The p-type regions 13 and the FLR 21 may be formed concurrently.

Next, as depicted in FIG. 8, a process including photolithography and a second ion implantation of an impurity as one set is repeatedly performed under different conditions, whereby in the edge termination region 20 (refer to FIG. 4), p-type regions (the p⁻-type region 22 and the p⁻⁻-type region 23) of the JTE structure and the n⁺-type channel stopper 24 are each selective formed in surface regions of the semiconductor substrate 30, at the front surface thereof (step S2 (part 2)). A sequence in which the p⁻-type region 22, the p⁻-type region 23, and the n⁺-type channel stopper 24 are formed may be variously changed.

Next, as depicted in FIG. 9, an entire area of the front surface of the semiconductor substrate 30, for example, is covered and protected by a carbon (C) protective film 50 and thereafter, a heat treatment (activation annealing) for activating the impurities implanted by the first and the second ion implantations is performed (step S3: third process). In the activation annealing at step S3, for example, the semiconductor substrate 30 is placed in a treatment furnace of heat treatment equipment, the atmosphere in the treatment furnace is evacuated (vacuumed) until the pressure becomes about $1 \times 10^{-2}$ Pa or lower and thereafter, an argon (Ar) gas is introduced into the treatment furnace and the heat treatment is performed under these conditions.

The ambient temperature of the semiconductor substrate 30 in the furnace during the activation annealing at step S3 or the temperature of the semiconductor substrate 30 itself (hereinafter, temperature of the activation annealing), for example, may be at least about 1700 degrees C. but, for example, not more than about 1900 degrees C., which is the maximum temperature that can be realized by annealing equipment for large area wafers having a diameter of about 6 inches, or preferably may be not more than, for example, about 1800 degrees C. A treatment time of the activation annealing at step S3, for example, is more than 20 minutes by not more than about 1 hour or preferably, may be at least about 30 minutes but not more than 40 minutes.

The temperature and the treatment time of the activation annealing at step S3 are set as the conditions described above, whereby the activation rate of the p-type regions 13 is increased and the contact resistance between the titanium film 31 and the p-type regions 13 may be set within the predetermined range described above. When the treatment time of the activation annealing at step S3 exceeds 1 hour, the amount of increase of the activation rate of the p-type regions 13 is reduced and an effect of improving the characteristics is saturated. When the temperature of the activation annealing at step S3 is high, the treatment time of the activation annealing may be shortened.

The activation rate of the p-type regions 13 by the activation annealing at step S3, for example, is in a range of about 70% to 80%. The activation rate of the p-type regions 13 by the activation annealing at step S3 increases the longer the treatment time of the activation annealing is and, for example, may be increased to about 80% to 90%. By the activation annealing at step S3, the higher the activation rate of the p-type regions 13 is set, the greater the contact resistance between the titanium film 31 and the p-type regions 13 may be reduced.

Next, as depicted in FIG. 10, for example, the carbon protective film 50 is removed by ashing, using ashing treatment (ashing) equipment. For example, reactive ion etching (RIE) equipment is used as the ashing equipment. A treatment furnace of the RIE equipment is set to an oxygen ($O_2$) gas atmosphere of a pressure of about 6 Pa and thereafter, high-frequency (radio frequency (RF)) power of about 500 W is applied and under the oxygen gas atmosphere converted to plasma, ashing is performed for about 5 minutes, thereby removing the carbon protective film 50.

Next, for example, by a thermal oxidation method and a chemical vapor deposition (CVD) method, on an entire area of the front surface of the semiconductor substrate 30, the thermal oxide film 16 and the deposited oxide film 17 (refer to FIG. 4) are sequentially stacked, thereby forming the field oxide film 15 (step S4). Next, by photolithography and etching, the field oxide film 15 is selectively removed, thereby forming the contact hole 15a that exposes an entire area of the active region 10 and a portion of the FLR 21 that is in the edge termination region 20, the portion facing the chip center (step S5).

Next, for example, by a physical vapor deposition (PVD) method such as sputtering, the titanium film 31 is formed from the surface of the field oxide film 15 and spans an entire area of the front surface of the semiconductor substrate 30 in the contact hole 15a. Next, by photolithography and etching, the titanium film 31 is left only in the contact hole 15a of the field oxide film 15 (step S6: fourth process). The titanium film 31 may extend onto the surface of the field oxide film 15.

Next, for example, the titanium film 31 is sintered by a heat treatment for about 10 minutes at a temperature of about 500 degrees C. By the heat treatment, the Schottky barrier junctions between the titanium film 31 and the n⁻-type drift region 12 are formed and the ohmic junctions between the titanium film 31 and the p-type regions 13 are formed (step S7). The thickness of the titanium film 31, for example, may be about 100 nm. Next, for example, by a physical vapor deposition method such as sputtering, the aluminum alloy film 32 having a thickness of, for example, about 5 μm is formed on the titanium film 31 (step S8).

Next, the semiconductor substrate 30 is ground from the back side and thinned to a position corresponding to a product thickness used for the silicon carbide semiconductor device 40 (wafer thinning). Next, for example, the back electrode 19 containing nickel, titanium, etc. is formed on an entire area of the back surface (back surface of the n⁺-type starting substrate 11) of the semiconductor substrate 30 by a physical vapor deposition method such as sputtering (step S9: fifth process). The back electrode 19 may be sintered by laser annealing or the like. Thereafter, the semiconductor wafer (the semiconductor substrate 30) is diced (cut) into individual chips (step S10), whereby the silicon carbide semiconductor device 40 depicted in FIGS. 1 and 4 is completed.

As described above, according to the embodiment, after the ion implantation for forming the p-type regions configuring the JBS structure of the SiC-SBD, the activation annealing is performed at a temperature in a range of about 1700 degrees C. to 1900 degrees C. for a treatment time of more than 20 minutes. As a result, between the titanium film that is the lowermost layer of the front electrode and the p-type regions configuring the JBS structure is free of a contact metal such as a nickel silicide film formed by a silicide reaction with the p-type regions, and the contact resistance between the titanium film and the p-type regions may be set to be in a range of, for example, about $5 \times 10^{-4}$ $\Omega \cdot cm^2$ to $8 \times 10^{-3}$ $\Omega \cdot cm^2$.

As a result, even when the forward current flowing in the SiC-SBD is a large current (surge current) that exceeds the rated current, current easily flows through the p-type regions configuring the JBS structure and bipolar operation by the pn junction portions between the p-type regions and the n⁻-type drift region is facilitated. Therefore, the forward current may further flow through the parasitic diode formed by the pn junctions between the p-type regions and the n⁻-type drift region without a delay and therefore, the surge current capability may be enhanced and device element destruction caused by heat generated due to the large current does not occur. As a result, the reliability of the SiC-SBD may be enhanced.

Further, according to the embodiment, between the titanium film that is the lowermost layer of the front electrode and the p-type regions configuring the JBS structure is free of a contact metal such as a nickel silicide film, whereby cost may be reduced.

Current-voltage characteristics (I-V characteristics) of the silicon carbide semiconductor device 40 according to the embodiment described above were verified. FIG. 11 is a table showing results of measurement of the contact resistance between the front electrode and the p-type regions configuring the JBS structure of a first experimental example. FIG. 12 is a characteristics diagram depicting current-voltage characteristics for the first to fourth experimental examples. The results of measurement of the contact resistance between the titanium film 31 and the p-type regions 13 of a SiC-SBD (hereinafter, the first experimental example) fabricated according to the above-described method of manufacturing the silicon carbide semiconductor device 40 according to the embodiment (refer to FIG. 5) are shown in FIG. 11.

The activation annealing conditions at step S3 in FIG. 5 differed for each of the samples of the first experimental example. In FIG. 11, the doped concentration [/cm³] of the p-type regions 13, the acceleration energy [keV] of the first ion implantation for forming the p-type regions 13, the heating temperature (implant temperature [° C.]) of the semiconductor substrate 30 during the first ion implantation, the temperature of the activation annealing (activation temperature [° C.])·treatment time (activation time [(minute)]) at step S3, presence of a contact metal (none), and the contact resistance between the titanium film 31 and the p-type regions 13 [$\Omega \cdot cm^2$] are shown.

From the results shown in FIG. 11, it was confirmed that for only a third sample for which the activation annealing at step S3 in FIG. 5 described above was performed within the predetermined condition ranges (activation temperature: in a range of about 1700 degrees C. to 1900 degrees C., activation time: more than 20 minutes), the contact resistance between the titanium film 31 and the p-type regions 13 could be set to be within a predetermined range (within a range of about $5 \times 10^4$ $\Omega \cdot cm^2$ to $8 \times 10^{-3}$ $\Omega \cdot cm^2$) even without providing a contact metal such as a nickel silicide film or p⁺-type contact regions like those in Japanese Patent No. 5474218 described above between the titanium film 31 and the p-type regions 13.

Thus, results of measurement of the current-voltage characteristics of the third sample of the first experimental example are shown in FIG. 12. In FIG. 12, a horizontal axis indicates voltage while a vertical axis indicates current density. In the third sample of the first experimental example, the temperature and the treatment time (activation time) of the activation annealing (activation temperature) at step S3 in FIG. 5 are 1700 degrees C. and 30 minutes (refer to FIG. 11). In FIG. 12, the current-voltage characteristics of the second, the third, and the fourth experimental examples are shown. The second to the fourth experimental examples differ from the third sample of the first experimental example in that the treatment times of the activation annealing at step S3 in FIG. 5 are 20 minutes, 10 minutes, and 5 minutes, respectively.

From the results shown in FIG. 12, it was confirmed that in the second to the fourth experimental examples, the rate of increase of the current density relative to the voltage increase during high-voltage application decreases, resulting in a saturated state B and in the saturated state B, heat is generated, leading to destruction. A reason that the current-voltage characteristics of the second to the fourth experimental example enter the saturated state B when high-voltage is applied is that the contact resistance between the titanium film 31 and the p-type regions 13 is a high resistance outside the above-described predetermined range (refer to first and second samples of first experimental example in FIG. 11), whereby the flow of current from the front electrode 14 to the p-type regions 13 becomes difficult.

Due to the flow of current from the front electrode 14 to the p-type regions 13 becoming difficult, bipolar operation by the pn junction portions between the p-type regions 13 and the n⁻-type drift region 12 becomes difficult, whereby large current concentrates locally, leading to heat generation and device element destruction. While not depicted, due to voltage increases thereafter, bipolar operation by the pn junction portions occurs and thus, for high voltages exceeding the saturated state B, the rate of increase of the current density relative to the voltage increase becomes greater than that in the saturated state B, whereby the local concentration of large current is mitigated, nonetheless, in most cases, in the saturated state B, heat is generated, leading to device element destruction.

Meanwhile, it was confirmed that in the third sample of the first experimental example, even during high-voltage application, the current-voltage characteristics are independent of the saturated state B and device element destruction did not result. A reason for this is that the contact resistance between the titanium film 31 and the p-type regions 13 is a low resistance within the above-described predetermined range, whereby bipolar operation by the pn junction portions between the p-type regions 13 and the n⁻-type drift region 12 is facilitated, forward current further flows, without delay, through the parasitic diode formed by the pn junctions between the p-type regions 13 and the n⁻-type drift region 12, and local concentration of large current is suppressed.

In the foregoing, the present invention is not limited to the embodiments described above and various modifications within a range not departing from the spirit of the invention are possible; the present invention is applicable to SiC-SBDs in which the p-type regions configuring the JBS structure are disposed in a predetermined pattern. Further, in the embodiment described above, while the structure is free of a contact metal such as a nickel silicide film between the front electrode and the p-type regions configuring the JBS structure, the present invention is further applicable to SiC-SBDs in which a contact metal is provided. Provision of a contact metal between the front electrode and the p-type regions configuring the JBS structure enables further reduction of the contact resistance between the front electrode and the p-type regions configuring the JBS structure.

According to the invention described above, the contact resistance between the titanium film and the second-conductivity-type regions may be reduced without providing, between the titanium film that is the lowermost layer of the first electrode and the second-conductivity-type regions, a contact metal such as a nickel silicide film formed by a silicide reaction with the second-conductivity-type regions. As a result, even when large current flows in the forward direction, bipolar operation by the pn junction portions between the second-conductivity-type regions and first-conductivity-type region occurs, and the forward current may pass.

The silicon carbide semiconductor device and the method of manufacturing a silicon carbide semiconductor device according to the present invention achieve an effect in that the surge current capability may be enhanced.

As described above, the silicon carbide semiconductor device and the method of manufacturing a silicon carbide semiconductor device according to the present invention are useful for power semiconductor devices used for power converting equipment, power converting devices of various types of industrial machines, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
    a semiconductor substrate containing silicon carbide, the semiconductor substrate having a first main surface and a second main surface that are opposite to each other;
    a first-conductivity-type region disposed in the semiconductor substrate, and having a surface that forms the first main surface of the semiconductor substrate;
    a second-conductivity-type region selectively provided in the first-conductivity-type region, and having a surface that forms the first main surface of the semiconductor substrate;
    a first electrode having a titanium film, the titanium film being provided on the first main surface of the semiconductor substrate, in contact with the first-conductivity-type region and forming a Schottky barrier junction with the first-conductivity-type region, and in contact with the second-conductivity-type region and further forming an ohmic junction with the second-conductivity-type region; and
    a second electrode provided on the second main surface of the semiconductor substrate, wherein
    a contact resistance between the titanium film and the second-conductivity-type region is in a range of $5\times10^{-4}$ $\Omega\cdot cm^2$ to $8\times10^{-3}$ $\Omega\cdot cm^2$, and
    between the first main surface of the semiconductor substrate and the first electrode is free of a contact metal formed by a silicide reaction with the second-conductivity-type region.

2. The silicon carbide semiconductor device according to claim 1, wherein
    the contact resistance between the titanium film and the second-conductivity-type region is in a range of $3\times10^{-3}$ $\Omega\cdot cm^2$ and $7\times10^{-3}$ $\Omega\cdot cm^2$.

* * * * *